United States Patent [19]

Kawabata et al.

[11] Patent Number: 5,093,291
[45] Date of Patent: Mar. 3, 1992

[54] PYROELECTRIC CERAMIC COMPOSITE STRUCTURE

[75] Inventors: Akira Kawabata, Uji; Tadashi Shiozaki, Kyoto; Masatoshi Adachi, Ootsu; Seiji Yamanaka, Yokose; Tamotsu Ueyama, Oyama, all of Japan

[73] Assignee: Mitsubishi Mining and Cement Company Ltd., Tokyo, Japan

[21] Appl. No.: 580,540

[22] Filed: Sep. 11, 1990

[30] Foreign Application Priority Data

Sep. 28, 1989 [JP] Japan .................. 1-250430

[51] Int. Cl.$^5$ .............................. C04B 35/49
[52] U.S. Cl. ...................... 501/134; 501/32; 252/62.9
[58] Field of Search ................. 501/32, 134; 252/62.9 PZT

[56] References Cited

U.S. PATENT DOCUMENTS

| | | | |
|---|---|---|---|
| 3,600,652 | 8/1971 | Riley | 501/134 |
| 4,109,359 | 8/1978 | Cross et al. | 29/25.35 |
| 4,119,554 | 10/1978 | Fujiwara | 501/134 |
| 4,550,088 | 10/1985 | Park et al. | 501/32 |

Primary Examiner—Mark L. Bell
Assistant Examiner—Deborah Jones
Attorney, Agent, or Firm—Hoffman, Wasson & Gitler

[57] ABSTRACT

A pyroelectric ceramic composition structure composed of ceramic agglomerations assembled from a plurality of pyroelectric ceramic compositions to form a structure with a high pyroelectric constant, and a second transition temperature below its curie temperature. The composition is made up of a compound of the formula:

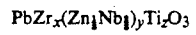

$$PbZr_x(Zn_{\frac{1}{3}}Nb_{\frac{2}{3}})_yTi_zO_3$$

wherein $X+Y+Z=1$, $X=0.72-0.95$; $Y=0.1-Z$ and $0<Z\leq 0.1$ an additive and a glass phase which acts to sinter together the agglomerates.

4 Claims, 2 Drawing Sheets

PYROELECTRIC CERAMIC COMPOSITE STRUCTURE

FIELD OF THE INVENTION

The present invention relates to a specific pyroelectric (piezoelectric) ceramic composite structure. Particularly, it relates to a pyroelectric composite structure having a high pyroelectric constant, and a second transition temperature below its Curie's temperature.

DESCRIPTION OF THE PRIOR ART

A piezoelectric ceramic composition evidences a sharp increase of both the pyroelectric coefficient and dielectric constant at a temperature neighboring the Curie temperature. Sharp increases of such constants can be generated by phase transition of a ferroelectric phase to another ferroelectric phase. When a pyroelectric composition has a phase transition temperature, (the second transition temperature) the transition of a ferroelectric phase to another ferroelectric phase, other than the Curie's temperature, at a temperature range of from ambient temperature to the neighborhood of 100° C., it can be conveniently used for a pyroelectric device under ambient atmosphere.

U.S. Pat. No. 4,119,554 discloses a ceramic dielectric composition including 35 to 93.5 percent by weight of $SrTiO_3$, 4 to 40 percent by weight of $Bi_2O_3$, at least 2.5 percent but less than 60 percent by weight of $TiO_2$, and 0.1 to 5.0 percent by weight, of an alkali metal oxide based on the total amount of $SrTiO_3$, $Bi_2O_3$ and $TiO_2$, having a high dielectric constant and low dielectric loss and reduced variations of dielectric constant and the dielectric loss with respect to variation of an applied voltage.

There have been many proposals for utilizing heat radiation such as infra red radiation emitted from a material, and detecting the temperature of the material by non-contact, to produce a temperature sensor. The demand for such a sensor has been great.

A temperature sensor produced by using a pyroelectric material is one of such sensors. They pyroelectric temperature sensor has the following features: 1) usable in a room temperature, 2) independence of wavelength of detecting radiation, 3) no need for a light source such as a photocell and a phototube, 4) detectable apart from the material to be measured without any attachment. Therefore, such a pyroelectric temperature sensor has recently become of significant interest.

Such a sensor has been desired to be developed for a wide variety of the applications of fields including 1) accident prevention such as invasion detector and fire detector, 2) automatic opening and closing system for a door, a curtain and a shutter, 3) an automatic lighting on and off system, 4) detection of vehicles passing by, 5) a non-contacting temperature detector used in electric cooking range and a laser power meter, and 6) pyrovision.

However, the demands to save energy and material have become higher, and therefore, the detection of the temperature at a position apart from the detector, i.e. non-contact measurement, is desired and needed. Therefore, a pyroelectric material evidencing high performance and high quality is strongly desired.

A variety of pyroelectric materials are known having the physical constants and properties as shown in Table 1.

TABLE 1

| | from "Electronics Ceramics, autumn edition of 1981 published by Gakken-Sha, page 57. | | | | | |
|---|---|---|---|---|---|---|
| | Pyroelectric Constant | Dielectric Constant | Curie' Point | Properties | | |
| Material | $P(10^{-8}/C/cmK)$ | $\epsilon_r$ | $T_c$ (°C.) | FM 10 Ccm/J | FMi 10 Ccm/J | $FM_o$ 10 Ccm/J |
| TGS | 4.0 | 35 | 49 | 4.6 | 1.6 | 2.7 |
| $LiTaO_3$ | 2.3 | 54 | 618 | 1.35 | 0.72 | 0.98 |
| $PbTiO_3$ | 2.0 | 200 | 470 | 0.93 | 1.9 | 1.3 |
| $Sr_{.48}Ta_{.52}Nb_2O_3$ | 6.5 | 385 | 115 | 0.81 | 3.1 | 1.6 |
| $BaTiO_3$ | 1.9 | 1,350 | 120 | 0.47 | 0.63 | 0.55 |
| PLZT6.5/65/35 | 10.0 | 1,400 | 164 | 0.23 | 3.9 | 1.0 |
| PZT-4 | 3.5 | 1,400 | 328 | 0.087 | 1.2 | 0.33 |

Where $FM_v = P/S \cdot \epsilon_r$, $FM_i = P/S$, $FM_D = P/S^*(\epsilon_r \tan\delta)^{\frac{1}{2}}$, S is a heat capacity, P is a pyroelectric constant, $\epsilon_r$ is dielectric constant and $\tan\delta$ is dielectric loss.

The pyroelectric materials shown in Table 1 are known as having the characteristics as shown in Table 1, i.e. intrinsic polarization, pyroelectric constant, and dielectric constant against the temperature.

In generally speaking, a pyroelectric constant is lower at a temperature range approximate to the room temperature, and increases drastically near to the Curie's temperature, and maximizes at the Curie's point. Further, the pyroelectric constant will be lowered to zero with increase of the temperature above the Curie's point.

The intrinsic polarization will decrease with an increase in temperature, and will be approximately zero above the Curie's point. The dielectric constant has a general tendency similar to that of the pyroelectric constant, and maximizes at the Curie's point.

The prior art pyroelectric materials are explained as follows; Tri-glycine sulphate crystal (TGS) has a) relatively significant performance in the properties such as a pyroelectric constant (P), a dielectric constant ($\epsilon_r$), volume specific heat ($C_v$), b) absorption of the radiation above a 2 micron wavelength, and c) is relatively easy to fabricate. However, TGS is a) a water soluble crystal, b) is costly to prepare, c) and has its Curie's point being present at a low temperature, i.e. at 49° C., and therefore, it is not practical. As a practical and commercialized pyroelectric material, crystalline material such as $LiTaO_3$, $LiNbO_3$, and $Sr_{1-x}Ba_xNb_6O_{15}$ can be listed. Particularly, $LiTaO_3$ and $LiNbO_3$ have a relatively high Curie's point, and they do not have the shortcomings of TGS, and they have a relatively low dielectric constant and therefore, stable performance near to the transition temperature. Because of the crystalline material, those materials can be obtained with high reproducibility.

Such crystals have the shortcomings as follows; a) they are costly to prepare because of the Czochralski method for crystal growth, b) large scales of crystal cannot be prepared, and c) the pyroelectric constant is low in the other range than the Curie's point range, therefore, the sensitivity will be unacceptably low when the area of the detector is small.

On the other hand, ceramics such as $PbTiO_3$ and $PbTiO_3$—$PbZrO_3$ solid solution are typical pyroelectric ceramics, and have a high Curie's point, high intrinsic polarization, and a relatively low dielectric constant (e.g. about 200 to 450). However, the pyroelectric constant of $PbTiO_3$ is about $2 \times 10^{-8}/°C./cm_2$ and therefore, is of low value, and it has the shortcoming of having less sensitivity. PZT ceramics have a relatively high dielectric constant such as 800 to 1,000, which will lower the sensitivity.

The fundamental requirements for the conventional pyroelectric material are as follows: 1) a high pyroelectric constant, and 2) detectivity on a target, (the value corresponding to S/N). However, in the conventional pyroelectric material, the characteristics thereof will significantly change when the temperature to be measured is changed. Therefore, a device using a conventional pyroelectric material would not be adaptable to changing circumstances in which the temperature is naturally changed in a variety of ranges, and therefore it is not practical under a variety of circumstances.

Generally speaking, a pyroelectric material has a Curie's point, and has a higher pyroelectric constant at the Curie's point. Further, an ordinary pyroelectric ceramic material has a drastic increase of the dielectric constant at the Curie's point range, and therefore, the performance of the sensitivity is significantly changed against the change in the circumstance temperatures, and the stability is lowered.

At a temperature range higher than Curie's point, polarization will disappear so that the pyroelectric coefficient will be zero. Accordingly, the temperature range in which the pyroelectricity (pyroelectric performance) can be utilized to measure the temperature should be a range of 100° C. or more lower than Curie's point. However, the pyroelectric coefficient of the known pyroelectric ceramics may be at its highest, $5 \times 10^{-8}/°C./cm^2$ or less, in the above-mentioned range. PLZT has the pyroelectric coefficient of $10 \times 10^{-8}/°C./cm^2$ but the dielectric constant of 1,000 to 1,400, and therefore, the performance, e.g. the sensitivity to the voltage is significantly low.

Further, a PZT composition having the ratio of Pb:Zr:Ti=96:4 to 70:30 has been recently studied in order to improve the pyroelectric performance. It has been found that this composition has a second transition temperature at a temperature range of 40° C. to 110° C., at the transition temperature of which the ferroelectric crystal phase transforms into another ferroelectric crystal phase, and the pyroelectric coefficient corresponding to the composition has a maximum value at this second transition temperature.

However, the PZT composition has the shortcomings in that when the second transition temperature is changed to higher, the pyroelectric coefficient is changed to be lower, and further, the sensitivity to the temperature is lower.

The further shortcoming is that the dielectric constant becomes higher as well as the sensitivity becomes lower, and the performance cannot be increased.

SUMMARY OF THE INVENTION

With the foregoing considerations in mind, the present invention contemplates the provision of a new pyroelectric ceramic composite structure to conquer the shortcomings of the prior art pyroelectric material, e.g. representative antiferroelectric crystals, such as $PbZrO_3$ series.

It is an object of the present invention to provide a pyroelectric composite specific structure having 1) a low dielectric constant in the specific temperature range of minus 10° C. to 110° C., 2) a high pyroelectric coefficient P, 3) high performance, e.g. high sensitivity, and 4) stable pyroelectric properties in the temperature range of minus 10° C. to 110° C.

It is another object of the present invention to provide a pyroelectric agglomeration structure having less temperature change for its pyroelectric properties.

It is a further object of the present invention to provide a ceramic pyroelectric composite structure comprising a plurality of agglomerations having different compositions of the formula of $PbZr_x(Zn_{\frac{1}{3}}NB_{\frac{2}{3}})_YTi_ZO_3$ wherein each of X, Y and Z is a predetermined value for each different composition, which pyroelectric structure has less change of coefficient in regard to the temperature change, by forming a body structure having two or more species of agglomerations having a different composition.

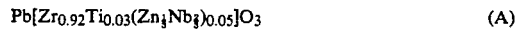

and

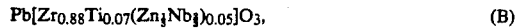

at the temperature range of from 0° C. to the neighborhood of 100° C. (a graph the pyroelectric current changes plotted against the temperature).

Figure 3:
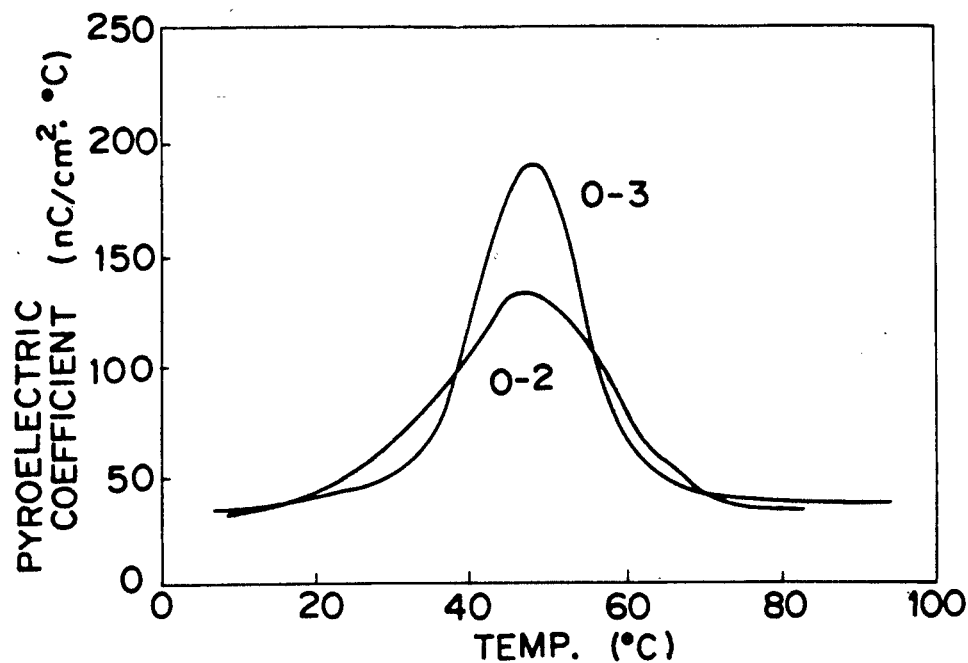

FIG. 3 is a graph showing the relation of the pyroelectric current with the temperature in the inventive compositions (Samples 0-2 and 0-3) obtained from fired mixtures of the above compositions (A) and (B).

Figure 4:
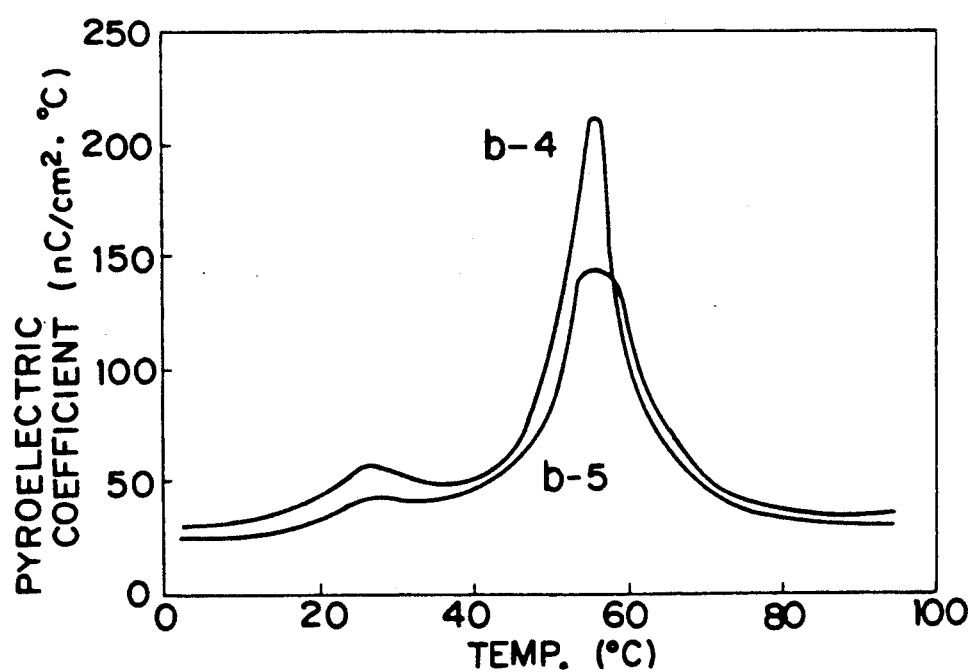

FIG. 4 is a graph showing the relation of the pyroelectric current with the temperature in the inventive compositions (Samples b-4 and b-5) obtained from the mixture of each grains of the fired bodies of the above compositions (A) and (B) at the predetermined ratio of the fired grains of each compositions.

DETAILED DESCRIPTION OF PREFERRED EMBODIMENTS

It is believed from the previous study of the prior art pyroelectric compositions that $PbZrO_3$ is a typical antiferroelectric and involves a number of near free energy levels present in the energy structure, and therefore, the inventors have studied a variety of this kind of composition and have found that a small amount of modifier can change the stabilities of a variety of characteristics and the various phases which are appearing.

A composition in the neighborhood of $PbZrO_3$ might have remarkable performance, and they studied the phase diagram and physical properties of a composition neighbor to $PbZrO_3$. As a result, they have found that a solid solution of $PbZrO_3$ and $Pb(Zn_{\frac{1}{3}}Nb_{\frac{2}{3}})O_3$, that is, $PbZr_X(Zn_{\frac{1}{3}}NB_{\frac{2}{3}})_{1-X})_3$ has a second transition temperature at which a ferroelectric crystal phase transforms into an other ferroelectric crystal phase, in a certain composition range, and further, it evidences a remarkably high pyroelectric constant P and a relatively low dielectric constant $\epsilon_r$.

However, they have found that the second transition temperature of $PbZr_X(Zn_{\frac{1}{3}}Nb_{\frac{2}{3}})_{1-X}O_3$ composition disappears when X is changed, and cannot be higher than the room temperature. They have studied further a variety of modifiers to improve the pyroelectric performance, and to develop the composition having the higher pyroelectric coefficient at a higher temperature than room temperature, and, found that the pyroelectric ceramic composite structure comprising a plurality of fired agglomerations having predetermined compositions different from each other, in which the compositions are in the range of the following formula: $PbZr_X(Zn_{\frac{1}{3}}Nb_{\frac{2}{3}})YTi_ZO_3$ wherein $X+Y+Z=1$, X is 0.72 to 0.95, $0<Z\leq0.1$, and each of the compositions contain less than 2 mole percent of additive(s), the additive being selected from the group consisting of manganese oxide, lanthanum oxide and a mixture thereof; and a glass phase to sinter or unify together said plurality of fired agglomerations has a second transition temperature at a wide range such as minus 10° C. to 100° C., and dielectric constant $\epsilon_r$ being low, and a pyroelectric coefficient P being high at the transition temperature, and the variation of those constants being lower with regard to the temperature change, but the pyroelectric current generated thereby being drastically reduced outside of the temperature range of from minus 10° C. to 100° C.

The ceramic composite structure with addition of the glass phase of lead germanate is significantly preferably.

The amount of the glass phase is preferably less than a 40 percent by weight based on the total weight of the composition.

Therefore, this kind of the composition can have high pyroelectric sensitivity and significant performance.

The inventors have found that a pyroelectric ceramic composite comprising a plurality of respective species of fired agglomerations having the predetermined different compositions of the general formula: $PbZr_X(Zn_{\frac{1}{3}}Nb_{\frac{2}{3}})YTi_ZO_3$ wherein $X+Y+Z=1$, each of X, Y and Z for each species is predetermined, and the each species having a high pyroelectric constant and a second transition temperature below its Curie's temperature evidences a significant pyroelectric performance.

Hitherto, when two or more species of the pyroelectric compositions of the formula: $PbZr_X(Zn_{\frac{1}{3}}Nb_{\frac{2}{3}})YTi_ZO_3$ wherein $X+Y+Z=1$, each of X, Y and Z for each species is predetermined are mixed, and fired, it is different to avoid solid solution or mutual reaction of the agglomerations having the different compositions. The solid solution or the mutual reaction will generate a composition different from the desired composition, so that desired temperature characteristics could be obtained.

In accordance with the present invention, the mutual reaction between the portions having the different compositions are restrained or miniaturized so as to result in the pyroelectric composite structure having respective temperature characterized due to each of the compositions.

In the inventive pyroelectric composite structure, the temperature at which the pyroelectric coefficient P evidences high can be increased to a temperature higher than the room temperature by mixing the agglomerations having the different compositions of the formula: $PbZr_X(Zn_{\frac{1}{3}}Nb_{\frac{2}{3}})YTi_ZO_3$ wherein $X+Y+Z=1$, each of X, Y and Z for each species is predetermined, and each species having a high pyroelectric constant and a second transition temperature below its Curie's temperature.

Further, each of the agglomerations contains a modifier which is selected from the group consisting of manganese oxide, lanthanum oxide and the mixture thereof, and further may contain a glass phase of preferably lead germanate in an amount of less than 40 mole percent based on the total weight of the agglomeration composition.

The second transition temperature $T_{C2}$ of each of the compositions used in the inventive composite structure appears over a wide range of from minus 10° C. to 100° C. The dielectric constant $\epsilon_r$ is lower (250 to 400), and the pyroelectric coefficient P is higher with less temperature dependency. Therefore, the inventive pyroelectric composite structure can be appropriately assembled to produce a pyroelectric infrared effective sensor.

The material of $PbZrO_3$ used in the inventive composite structure is a typical antiferroelectric and involves a number of near free energy levels present in the energy structure, and therefore, the addition of the small amount of the modifier will change the stability of the various characteristics of the composition so as to provide various crystal phases.

The inventors studied in detail the phase diagram and the physical properties of the composition in the neighborhood of $PbZrO_3$.

They have studied a composition in phase diagram of $X—PbZrO_3—Y—Pb(Zn_{\frac{1}{3}}Nb_{\frac{2}{3}})O_3—Z—PbTiO_3$, and have known that the maximum values of pyroelectric coefficient and dielectric constant will reside in the neighborhood of the composition of $X—PbZrO_3—Z—PbTiO_3$ in the ratio of $X/Z=53/47$. They concentrated their studies on the composition range in the neighborhood of $PbZrO_3$ and $PbTiO_3$ in a three component diagram of $X—PbZrO_3—Y—Pb(Zn_{\frac{1}{3}}Nb_{\frac{2}{3}})O_3—Z—PbTiO_3$. As a result, they found that when a specific modifier is used, added to those compositions near to $PbZrO_3$, the second transition temperature appears at a wide temperature range of from about minus 10° C. to about 100° C., at the phase transition of ferroelectric phase from a rhombohedral system to another rhombohedral system, and further, this transition temperature can be shifted to a lower side with an increase of the modifier added amount within the range of minus 10° C. to about 100° C.

They have further found that the intrinsic polarization is drastically changed at the transition temperature. As known, the pyroelectric coefficient is a temperature coefficient of spontaneous polarization. The pyroelectric coefficient can be maximized near to the transition temperature, and it can be a number one or two figures higher than that at a temperature near to the transition temperature.

The dielectric constant is unexpectedly not changed within a range near to the transition temperature.

However, the pyroelectric current is drastically decreased at a range out of the transition temperature, therefore, it is a problem in practice to assemble an infrared device used to detect the circumstance temperature which changes over a wide range.

The inventors studied various kinds of pyroelectric compositions. The second transition temperature $T_{C2}$ of each of the compositions used in the inventive composite structure appears over the wide range of minus 10° C. to 100° C. The dielectric constant $\epsilon_r$ is lower (250 to 400), and the pyroelectric coefficient P is higher with less temperature dependency. Therefore, it is found that the inventive pyroelectric composite structure can be appropriately assembled to produce a pyroelectric infrared effective sensor.

They have studied further a variety of modifiers to improve pyroelectric performance, and to develop a composition having a higher pyroelectric coefficient at a higher temperature than room temperature. It was found that when as a modifier, a small amount of manganese oxide is added to the pyroelectric composition of $PbZr_X(Zn_{\frac{1}{3}}Nb_{\frac{2}{3}})_YTi_ZO_3$ wherein $X+Y+Z=1$, X is 0.72 to −0.95, $0<Z\leq0.1$; the second transition temperature and the pyroelectric properties are not changed, but the dielectric constant is extremely minimized. Further, it was found that even when lanthanum oxide is added to the pyroelectric composition, a mutual reaction or solid solution is not generated.

Further, the performance of the pyroelectricity is determined by the pyroelectric coefficient, the volume specific heat and the dielectric constant. That is, it is dependent on 1) voltage sensitivity ($F_v$=pyroelectric coefficient $P/$ volemic specific heat $C_v \times$ specific dielectric constant $\epsilon_r$) and 2) detectivity ($F_D=C_V \cdot (\epsilon_r \cdot \tan\delta)^{\frac{1}{2}}$).

When the pyroelectric material is used for a pyroelectric type infrared sensor, a material having a high pyroelectric coefficient, a lower dielectric constant and a dielectric loss is preferable. The second transition temperature should be appearing at a wide range such as minus 10° C. to 110° C., and the dielectric constant should be low, and the pyroelectric coefficient should be high at the transition temperature. Therefore, this kind of the composition should have pyroelectric sensitivity and significant performance.

The addition of a small amount of a modifier will change the stability of various coefficients, and, the specific range of the compositions $PbZr_X(Zn_{\frac{1}{3}}Nb_{\frac{2}{3}})_YTi_ZO_3$ wherein $X+Y+Z=1$ with the modifier of Mn and/or La oxide has the second transition temperature at about minus 10° C. to 110° C., and a low dielectric constant, and a high pyroelectric coefficient P at the transition temperature, the change of pyroelectric coefficient in regard to the temperature change is low, i.e. stable pyroelectric coefficient. The pyroelectric current is drastically decreased in the neighborhood of the transition temperature. Therefore, this kind of the composition can not be used under the condition that the ambient temperature is widely changed.

Therefore, two or more species of agglomerations of $PbZr_X(Zn_{\frac{1}{3}}Nb_{\frac{2}{3}})_YTi_ZO_3$ wherein $X+Y+Z=1$, each of the compositions containing less than 2 mole percent of modifier(s) are mixed together and sintered to be unified thereby producing a pyroelectric composite with a stable pyroelectric coefficient (less change of pyroelectric coefficient in regard to the change of temperature). The two or more species of such pyroelectric compositions can be unified by firing at a temperature range of 1100° C. to 1250° C. so as to form a unified sintered pyroelectric composite. In unifying or sintering two or more species of the compositions, a mutual reaction or solid solution could not be avoided hitherto, but the present invention can resolve such problems.

In accordance with the present invention, the mutual reaction, i.e. solid solution between species of the compositions can be avoided or minimized so as to form fired pyroelectric composite having stable pyroelectric coefficient (less change of the coefficient in regard to the temperature change.

In the preparation of the composite structure comprising two or more species of agglomerations having respectively different compositions, it is believed to be difficult to avoid the mutual reaction or solid solution of the agglomerations having the different compositions. The mutual reaction or solid solution will give a product having a composition different from the desired composition. It has been known that such solid solution or mutual reaction could not be avoided in firing at a temperature of 1250° C.

Figure 2:
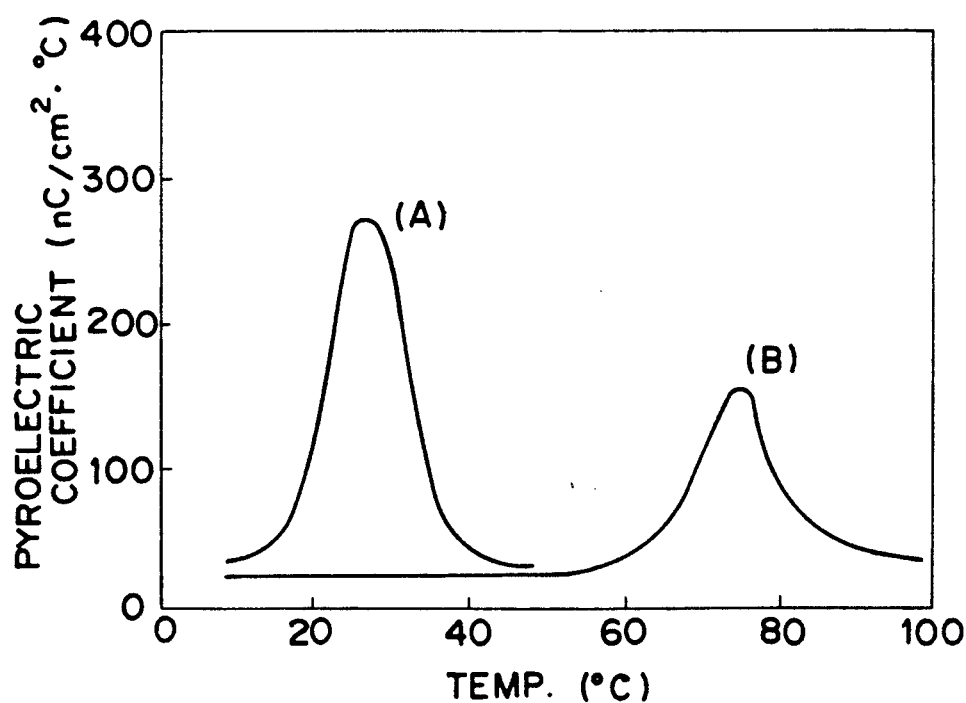
FIG. 2 is a graph showing the temperature properties of pyroelectric current generated in the prior art pyroelectric ceramic compositions.

FIG. 2 is a graph showing each of pyroelectric current curves obtained by two species of the compositions having

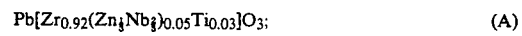

$$Pb[Zr_{0.92}(Zn_{\frac{1}{3}}Nb_{\frac{2}{3}})_{0.05}Ti_{0.03}]O_3; \qquad (A)$$

and

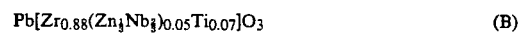

$$Pb[Zr_{0.88}(Zn_{\frac{1}{3}}Nb_{\frac{2}{3}})_{0.05}Ti_{0.07}]O_3 \qquad (B)$$

versus the temperature over the range of from 0° C. to 100° C.

FIG. 3 is a graph showing pyroelectric current versus the temperature in a pyroelectric composite without any agglomeration, which is prepared by firing respectively each of the powders of the compositions (A) and (B) at a temperature of 900° C., and mixing the two species of the fired powders (A) and (B) in a predetermined ratio, and molding into a shape, and firing the resulting shaped body of the mixture of the powders (A) and (B) at a temperature of 1250° C. for 20 minutes or 30 minutes so as to form a pyroelectric composite structures (Samples 0-2 and 0-3).

FIG. 4 is a graph showing pyroelectric current generated in the pyroelectric composite structures (Samples b-4 and b-5) versus the temperature, which samples (structures) were prepared by firing the powders of the compositions (A) and (B) respectively at the temperature of 1150° C., and mixing the resulting fired powders the compositions (A) and (B) in the predetermined ratio, and molding in a shape, and firing the shaped body at a temperature of 1250° C. for 20 or 30 minutes.

The inventors have further developed various compositions and a method of the preparation of the pyroelectric compositions and the pyroelectric compositions in which the pyroelectric performance is stable over a wide range of from the room temperature to 100° C., and the pyroelectric coefficient is converged to a certain value with high pyroelectricity, and less temperature dependency.

The composite structure of such pyroelectric agglomerations having different compositions each from the other, i.e. the structure comprising two or more species of agglomerations having different pyroelectric compositions can evidence the total pyroelectric performance of the combination of those of the discrete pyroelectric compositions and the total combination of temperature—pyroelectric properties of the independent pyroelectric agglomerations, one stable over a wide range, and the dielectric constant is 250 to 400 with high performance.

Each of the agglomerations used in the inventive composite structure have a second transition temperature, and a lower dielectric constant, and a higher pyroelectric coefficient. However, the peak of the pyroelectric coefficient is sharp, and the temperature coefficient is lower, and therefore, the mixture or combination of various compositions (agglomerations) is unified or sintered together, so as to form a composite having stable temperature properties (coefficient). In the prior method, the different compositions can produce mutual reaction or solid solution between them, if the mixture of the compositions is fired at high temperature such as 1250° C., the solid solution and the mutual reaction can not be avoided.

In accordance with the present invention, the composite pyroelectric structure contains glass material to form glass phase thereby accelerating sintering of the discrete agglomerations in the structure. Preferable glass material is a material which does not react with the pyroelectric material or composition, and does not generate solid solution with the pyroelectric material or composition. Lead glass material such as lead germanate $Pb_5Ge_3O_{311}$ is especially preferable because it does not affect the pyroelectric composition. The addition of glass material can facilitate liquid sintering between two or more species of agglomerations, and therefore, the sintering temperature of a certain mixture of the fired powders (agglomerations) is improved from 1250° C. to a relatively lower temperature of 1110° C. The agglomeration composite structure can be sintered at such lower temperature for a shorter period of time to form a strong composite structure with sintering. When the structure has relatively smaller size of agglomerations, a solid solution or dispersion can be easily caused so that original strength and original pyroelectric properties can not be maintained. The firing at a relatively higher temperature of the agglomeration composite is preferable. The composite structure can be denser because of liquid sintering of agglomerations by inclusion of a glass phase, and, it enables the maintenance of the original core of each of the agglomeration compositions, so that the original properties can be maintained in the composite structure of the present invention.

Figure 1:
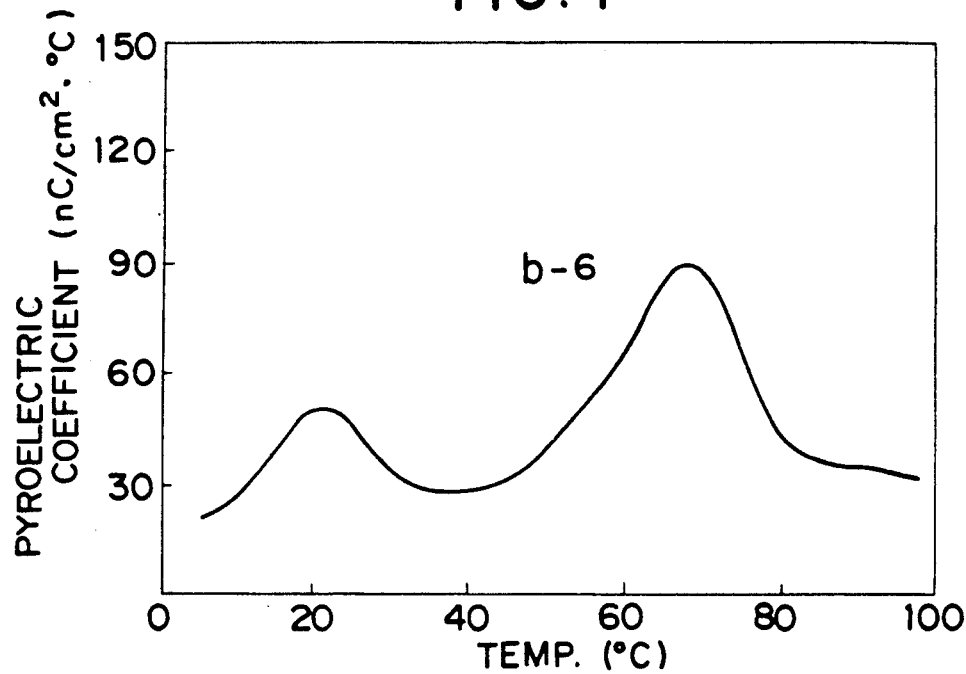
FIG. 1 is a graph showing the temperature properties of pyroelectric current generated in the pyroelectric ceramic composition (Sample b-6 of Example) obtained from fired mixture of the compositions (A) and (B), at the temperature range of 0° C. to the neighborhood of 100° C. (a graph showing the pyroelectric current change plotted against the temperature, in that the pyroelectric current has the maximum value near the second transition temperature in regard with the inventive pyroelectric composition: Sample b-6.)

As a result, the composite structure of the present invention can have the combination of the original properties of the agglomerations of the different compositions, as shown in FIG. 1. FIG. 1 is a graph showing pyroelectric current generated in the inventive composite structure over a temperature range of from 0° C. to about 100° C.

The inventive pyroelectric composite structure is a mixture of fired agglomerations each of which has the different compositions of the formula: $PbZr_X(Zn_{\frac{1}{3}}Nb_{\frac{2}{3}})_YTi_ZO_3$ wherein $X+Y+Z=1$, X is 0.72 to 0.95, $0 < Z \leq 0.1$, and each of the compositions contain less than 2 mole percent of additive(s), the additive being selected from the group consisting of manganese oxide, lanthanum oxide and the mixture thereof; and a glass phase to sinter together said plurality of fired agglomerations. The amount of the glass phase is preferably 0.05 to 40 percent by weight based on the total weight of all components in the agglomeration.

Accordingly, the starting materials are $PbZrO_3$, $Pb(Zn_{\frac{1}{3}}Nb_{\frac{2}{3}})O_3$ and $PbTiO_3$. Those materials can be prepared from each component, that is, a metal inorganic salt such as an oxide, carbonate, and sulphate, hydroxide, metal alkoxide and organic metal compounds, or complex oxide such as $ZrTiO_3$. Alternatively, powders of $PbZrO_3$, $PbTiO_3$, and $Pb(Zn_{\frac{1}{3}}Nb_{\frac{2}{3}})O_3$ can be used to be mixed for the preparation of the pyroelectric composite in the desired ratio.

The starting materials for the preparation of the inventive pyroelectric composite structure can be an inorganic salt such as oxides, carbonates, sulfates of each element to form each composite agglomerations; and hydroxide, alkoxide compounds and organic metal compounds of said elements, and a complex oxide of two or more elements such as $ZrTiO_3$. Alternatively, the powders of $PbZrO_3$, $PbTiO_3$ and $Pb(Zn_{\frac{1}{3}}Nb_{\frac{2}{3}})O_3$ can be prepared and then mixed in a desired ratio, fired and milled to produce the starting powders for each of the desired agglomeration of the desired compositions. The agglomeration of the desired compositions can be prepared by mixing the powder starting materials in the appropriate ratio corresponding to the desired composition, firing the mixed powder, and milling the fired powder. Alternatively, the agglomerations can be prepared by mixing several materials in the predetermined ratio, firing to produce the fired powder, and then, forming a shape from the fired powder, firing in an atmospheric pressure, and milling the fired shape to produce the starting materials for the preparation of the inventive composite structure.

Next, the resulting fired agglomerations of the desired compositions have respectively the temperature pyroelectric characteristics of two or more species of the fired powders having respectively the temperature pyroelectric characteristics are mixed, and further to the resulting mixture, is added a glass phase material, e.g. $Pb_5Ge_3O_{11}$, to form a glass phase when heated at a high temperature in the predetermined ratio (amount). The mixture is moulded into a shape, and fired so as to produce the pyroelectric composite structure of the present invention.

A mixture of agglomerations having respectively different compositions are used and moulded into a shape, which is fired at appropriate temperature in a housing of magnesia, and the loss of lead should be monitored by controlling or adjusting the pressure of atmospheric gas, so as to produce the composite structure of the present invention in the desired composition.

A voltage of several KV/mm is applied to the surfaces of the resulting fired body of composite pyroelectric structure so as to produce a pyroelectric assembly for an appropriate purpose.

The conditions for forming the composite structure, such as a forming temperature, and a forming pressure, and further a firing temperature, and the applying voltage all can be appropriately chosen based on the binder, the composition, the starting materials, and the grain size of the starting materials.

Preferably, the inventive new pyroelectric composition can be used in a variety of applications including 1) accident prevention and such invasion detector and fire detector, 2) automatic opening and closing system for a door, a curtain and a shutter, 3) automatic lighting on and off system, 4) detection of vehicles passing by, 5) non-contacting temperature detector used in electric cooking range and a laser power meter, 6) pyrovision, 7) laser powermeter, and 8) a temperature sensor in use for a microwave heater.

The present invention is further illustrated by the following example to show manufacture of the inventive pyroelectric composition, and multilayered structure using the new composition, but should not be interpreted for the limitation of the invention.

EXAMPLE

Powders of $PbTiO_3$, $PbZrO_3$, PbO, ZnO, $Nb_2O_3$; and $MnO_2$ and $La_2O_3$ (as a modifier) with a size of 0.5 microns in average, and a purity of about 99.5% were used as starting materials, in a predetermined molar ration of $PbTiO_3$, $PbZrO_3$, and $Pb(Zn_{\frac{1}{4}}Nb_{\frac{3}{4}})O_3$ which is corresponding to the predetermined composition of the formula; i.e.

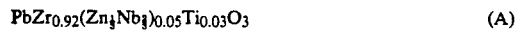
$$PbZr_{0.92}(Zn_{\frac{1}{4}}Nb_{\frac{3}{4}})_{0.05}Ti_{0.03}O_3 \qquad (A)$$

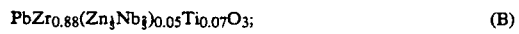
$$PbZr_{0.88}(Zn_{\frac{1}{4}}Nb_{\frac{3}{4}})_{0.05}Ti_{0.07}O_3; \qquad (B)$$

and further, as a modifiers, $MnO_2$ and/or $La_2O_3$ were measured to amount 1 mole percent based on the total amount of the composition, and mixed in a ball mill using acetone media.

Then resulting mixture is put in an enameled pad, and dried thermally. The dried mixture was moulded into a shape under a pressure of 800 kg/cm², then, the shaped material was calcined for about two hours at 900° C., or 1150° C., and milled to provide a powder having a particle size of below one micron.

Then, to the calcined powder was added 3.0 weight percent of $Pb_5Ge_3O_{11}$, and (a) the total powder was milled wet in a ball mill, dried and graded, and moulded under a pressure of 840 kg/cm² into a disc shape. Alternatively, (b) the total powder was agglomerated and agglomerations were mixed and moulded under a pressure of 840 kg/cm² into a disc shape in the same condition.

Glass component of $Pb_5Ge_3O_{11}$ was further added to the powder before the milling in the amount of 3.0 weight percent base on the total composition so as to produce Samples b-1, b-2 and b-6 to b-9.

Each of the shaped discs were heated at a temperature lifting rate of 2° C./minute to a predetermined temperature within the range of 1000° C. to 1250° C., and then maintained at this temperature for three hours respectively in a magnesia enclosure.

Next, each of the resulting calcined samples were polished into the thickness of 1 mm, and then, silver electrode was stoved on the surface of the disc at 550° C. for the measurement of pyroelectric properties. Further, each of the samples were polarized by applying 2 kV/mm for 30 minutes under the temperature of 120° C.

Upon the application of potential on each of the samples, electrodes were formed on the surfaces of each of the samples by short-circuit of the electrodes, and then, the samples were kept in a constant temperature oven at a temperature of 90° C. for 12 hours for aging. Then, the dielectric constants and pyroelectric coefficients were measured by using an impedance analyzer and a picoamperemeter.

The pyroelectric current at 1M Hz was measured against the temperature. The result is shown in FIG. 1.

General tendencies for the pyroelectric properties of the sample b-6 are shown in FIG. 1 in terms of the pyroelectric coefficient.

The dielectric constants ($\epsilon_r$) and the values of dielectric loss (tan$\delta$) were measured against the presence or absence of the glass phase of $Pb_5Ge_3O_{11}$, the preparatory firing temperature, the agglomeration process or not, the firing time, the firing temperature, and the sintering state of the composition.

The result is shown in Table 2.

TABLE 2

Result of Measurement of Dielectric Constant ($\epsilon_r$) and tan$\delta$ against changing the parameters; addition of $Pb_5Ge_3O_{11}$ glass, preparatory firing temperature, agglomeration or not, firing time period, firing temperature and sintering state:

| SAMPLE NUMBER | ADDITION OF GLASS COMPONENT ($Pb_5Ge_3O_{11}$) | TEMPERATURE OF PREFIRING | WAS AGGLOMERATION FOUND | FIRING TEMP. | FIRING TIME | WAS SINTERING FOUND | DIELECTRIC CONSTANT | TAN$\delta$ (%) |
|---|---|---|---|---|---|---|---|---|
| 0-1 | None | 900° C. | None | 1150° C. | 60 min. | None | | |
| 0-2 | None | 900° C. | None | 1250° C. | 20 min. | | | |
| 0-3 | None | 900° C. | None | 1250° C. | 30 min. | | 316 | 2.5 |
| a-1 | Present | 900° C. | None | 1100° C. | 30 min. | | 377 | 3.2 |
| a-2 | Present | 900° C. | None | 1000° C. | 30 min. | None | | |
| b-1 | Present | 900° C. | Present | 1100° C. | 30 min. | | 375 | |
| b-2 | Present | 900° C. | Present | 1000° C. | 30 min. | None | | |
| b-3 | None | 1150° C. | Present | 1220° C. | 70 min. | None | | |
| b-4 | None | 1150° C. | Present | 1250° C. | 20 min. | | 279 | 2.6 |
| b-5 | None | 1150° C. | Present | 1250° C. | 30 min. | | 252 | 2.6 |
| b-6 | Present | 1150° C. | Present | 1100° C. | 30 min. | | 255 | 2.6 |

It was found from FIG. 3 that when the mixture of the agglomerations (two species of powders) fired previously at a lower temperature, e.g. 900° C. is shaped and fired at the temperature of 1250° C., two species of agglomerations generated a solid solution of the two species of the compositions (A) and (B), and the pyroelectric peak of that corresponding to the intermediate composition of the two compositions. Further, when the two species of powders fired at the temperature of 1150° C. for two hours is used, and mixed to form the agglomeration composite structure, the resulting agglomeration composite structure evidences a similar result.

Because the firing temperature for the preparation of the fired powders (agglomerations) is lower for the former case, the size of the agglomerations is relatively smaller, and a solid solution or dispersion can be easily produced. Especially in the case (e.g. Sample a-1) where a glass phase is included in the agglomeration, the solid solution or the mutual reaction can be easily produced even in the preparation of the composite structure by firing at a lower temperature such as 1100° C., so that the resulting pyroelectric properties correspond to that of the intermediate composition between the two species compositions.

When the firing temperature for the preparation of the fired powders (agglomerations) (for the production of Samples b-4 and b-5) is relatively higher e.g. 1150° C., the reaction has been expected to be restrained, but the result is questionable.

When the agglomeration is prepared by firing at 1150° C. together with addition of a glass phase material (to produce Sample b-6), the composite structure can be produced by firing at the lower temperature e.g. 1100° C., and the resulting pyroelectric properties are as shown in FIG. 1, corresponding to the combination of those of the materials having a respectively different composition, i.e., the pyroelectric composite structure of the invention.

FIG. 1 reveals that the second transition temperatures $T_{C2}$ of each of the compositions were appearing i.e. the pyroelectric current has the maximum values at each of the second transition temperature. The maximum pyroelectric values were appearing in the range of minus 10° C. to 80° C. In view of the graph of FIG. 2 showing the pyroelectric current curves of the two species of the different compositions (A) and (B), the graph of FIG. 1 can be recognized to be seemingly the combination of the two curves (A) and (B).

Further, while a glass material such as lead germanate to form the glass phase in the composite structure is used, other glass materials can be used so long as they do not affect the pyroelectric structure of the compositions. The amount of the glass material to be added is preferably 0.05 to 40 percent by weight, more preferably 0.5 to 10.0 percent by weight.

The inventive composite pyroelectric structure can be used as an infrared pyroelectric sensor, and miniaturization of the device can be facilitated because the structure will generate a high pyroelectric current over a wide range of temperatures, and it can not be affected by any of ambient condition, e.g. ambient temperature. The device manufactured by using the inventive pyroelectric composite structure will detect the temperature at the position apart far from the device, without any contact, and can be used under severe conditions.

Further, the performance of the pyroelectricity on 1) specific dielectric constant $\epsilon_r$ and 2) dielectric loss (tan$\delta$) is as shown in Table 2.

It is clear that when the inventive pyroelectric composite structure is used in an infrared ray sensor, the device can be miniaturized, and can be used over the wider range of the measuring temperature, with high sensitivity.

The reason why such significant effect can be obtained by the inventive pyroelectric composite structure may be considered as follows:

Generally speaking, when materials having similar compositions being contacted together in combination, are fired, particularly compositions containing liquidizable substances such as a glass phase, the particles having the similar compositions, being contacted in the combined materials will produce a solid solution at the interface between the particles. Therefore, in such case, the characteristics of the fired combined powders would not mostly be the same as the total combination of the characteristics of the discrete materials.

However, in the inventive pyroelectric composite structure, the total characteristics thereof would equal the total combination of each characteristics of the discrete pyroelectric agglomerations, each of which has respectively a different composition. In the preparation of the inventive composite structure, each of the composition components was previously fired to produce firmly fired agglomerations having a stable chemical structure, which was again milled, and then, the milled powder was used to form a shape, which was mixed and combined. Therefore, a reaction at the interface between the grains to produce a solid solution phase would be minimized or controlled.

Such effect was seen in the Example, and in the preparation of the composite structure of the Example, several species of different agglomerates each of which has the different compositions were fired and formed.

A fritless platinum past was applied on the polished surface(s) of the resulting structure by a printing technique, and such a structure can be used for various kinds of applications.

The fired different composition agglomerates would generally not react, and therefore, in the composite structure, the reaction between the agglomerations adjacently in contact with each other would not take place because the fired agglomerations are used and mixed. Therefore, the reaction to produce a solid solution phase would be restrained.

Further, another paste such as silver paste, gold paste, palladium paste and the combination thereof can be used in place of platinum paste, whereas the used paste provides less reactivity or unreactivity.

It is clear that when the inventive pyroelectric composite structure is used in an infrared sensor, the device can be miniaturized, and can be used in the wider range of the measuring temperature, e.g. minus 10° C. to about 100° C., with high sensitivity, because the pyroelectric current is substantially constant even when the ambient temperature is changed.

Secondly, high performance of pyroelectricity can be obtained over a level unexpected from the prior art pyroelectric ceramic material, and the inventive pyroelectric structure is very practical in application for an infrared temperature sensor.

Thirdly, the voltage sensitivity and detectivity for a pyroelectric type sensor can be increased and highly improved.

As described in the foregoing, the inventive ceramic pyroelectric composite structure will enable one to miniaturize the device to detect infrared radiation or a temperature at a position apart from the device. Further, the inventive ceramic pyroelectric composite structure can enable one to facilitate the miniaturized thermal detector.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

We claim:

1. A pyroelectric ceramic structure comprising a plurality of fired agglomerations having differing compositions and wherein said compositions are selected from the range of a composition having a formula of:

$$PbZr_x(Zn_{\frac{1}{3}}Nb_{\frac{2}{3}})_yTi_zO_3$$

wherein $x+y+z=1$, $x=0.90$, $y=0.1-z$, and $0<Z\leq 0.1$ an additive selected from the group consisting of manganese oxide, lanthanum oxide and mixtures thereof; and a glass phase, whereby said glass phase acts to sinter together said plurality of agglomerations.

2. A pyroelectric ceramic structure in accordance with claim 1 wherein said additive is present in an amount less than or equal to 2 mole percent of said composition.

3. A pyroelectric ceramic structure as claimed in claim 1 wherein said glass phase is lead germanate.

4. A pyroelectric ceramic structure as claimed in claim 1 wherein said glass phase is present in an amount of 0.05 to 40 percent by weight of the total weight of the composition.

* * * * *